(12) United States Patent
Morita

(10) Patent No.: US 10,122,360 B2
(45) Date of Patent: Nov. 6, 2018

(54) TOUCH PANEL DEVICE

(71) Applicant: DENSO WAVE INCORPORATED, Chita-gun, Aichi-pref. (JP)

(72) Inventor: Yuya Morita, Chita-gun (JP)

(73) Assignee: DENSO WAVE INCORPORATED, Aichi-pref (JP)

( * ) Notice: Subject to any disclaimer, the term of this patent is extended or adjusted under 35 U.S.C. 154(b) by 319 days.

(21) Appl. No.: 14/854,375

(22) Filed: Sep. 15, 2015

(65) Prior Publication Data

US 2016/0226489 A1  Aug. 4, 2016

(30) Foreign Application Priority Data

Feb. 3, 2015 (JP) .................................. 2015-019405

(51) Int. Cl.
*H03K 17/96* (2006.01)
*G06F 3/044* (2006.01)

(52) U.S. Cl.
CPC .......... *H03K 17/962* (2013.01); *G06F 3/044* (2013.01); *H03K 2217/9607* (2013.01); *H03K 2217/960705* (2013.01)

(58) Field of Classification Search
CPC ... F24F 11/02; F24F 2011/0091; G06F 3/041; G06F 3/044; H03K 17/962; H03K 2217/9607; H03K 2217/960705
See application file for complete search history.

(56) References Cited

U.S. PATENT DOCUMENTS

| | | | | |
|---|---|---|---|---|
| 5,977,957 A | * | 11/1999 | Miller | G06F 1/32 178/18.01 |
| 2015/0160771 A1 | * | 6/2015 | Takeuchi | G06F 3/0414 345/177 |
| 2015/0355774 A1 | * | 12/2015 | Johansson | G06F 3/0416 345/173 |

FOREIGN PATENT DOCUMENTS

| | | |
|---|---|---|
| JP | H05-110894 A | 4/1993 |
| JP | 2014-016924 A | 1/2014 |

* cited by examiner

*Primary Examiner* — Stephen W Smoot
(74) *Attorney, Agent, or Firm* — Oliff PLC

(57) ABSTRACT

When sampling an A/D-converted data of a voltage signal that a touch IC outputs at a fixed period, a microcomputer of a touch panel device monitors a variation in data values within a monitoring time, and changes a timing of sampling the data when a frequency of the variation exceeds an allowed value. Then, the timing is kept constant and the data is sampled when the frequency of the variation is within a range of the allowed value.

8 Claims, 5 Drawing Sheets

TOUCH PANEL DEVICE

CROSS-REFERENCE TO RELATED APPLICATION

This application is based on and claims the benefit of priority from earlier Japanese Patent Applications No. 2015-019405 filed Feb. 3, 2015, the description of which is incorporated herein by reference.

TECHNICAL FIELD

The present disclosure relates to a device provided with a touch panel, which operates when AC power supply is being supplied, for a user to input an operation instruction for controlling an apparatus.

BACKGROUND

By capturing a change in capacitance generated by a user performing a touch operation, a touch panel recognizes the touch operation and outputs a signal corresponding to content of the operation (refer to Japanese Patent Application Laid-Open Publication No. 2014-16924, for example).

Such a touch panel is applied to a remote control that is disposed on a wall of a room or the like for controlling an air conditioner, for example.

DC power generated from a commercial AC power source is supplied to the above-mentioned touch panel for operation.

The capacitance of the touch panel is converted into a voltage signal, and a control circuit determines whether a touch operation has occurred by capturing the change of the capacitance by A/D-converting and sampling the voltage signal.

In this case, a ground potential of a circuit board is preferably equal to an earth potential, which is a potential reference of the user who performs the touch operation.

However, an area of a ground pattern of the circuit board cannot be sufficiently secured when the size of the touch panel device becomes compact, therefore impedance rises and the device is influenced by noise, and there may be a case where the ground potential is different from the earth potential.

When the control circuit A/D-converts the voltage signal under such a situation, there is a possibility that a variation occurs in the value of the A/D-converted data and the circuit may therefore erroneously detect the presence of a touch operation.

SUMMARY

An embodiment provides a touch panel device that can eliminate the influence of noise having periodicity, and can detect touch operation with high accuracy.

In a touch panel device according to a first aspect, the touch panel device includes a touch panel, which is operated when AC power supply is being supplied, for a user to input an operation instruction for controlling an apparatus such as an air conditioner, a signal output unit that A/D converts a voltage signal corresponding to a change of capacitance in the touch panel and outputs converted data, and a control circuit that determines whether a touch operation of the touch panel has occurred or not by sampling the data with a predetermined period, and outputs a detection result to the signal output unit.

The control circuit monitors a variation of values of the data for a predetermined period of time, and changes a timing of sampling the data when a frequency of the variation exceeds an allowed value, and the timing is kept constant and the data is sampled when the frequency of the variation is within a range of the allowed value.

In other words, when noise having periodicity such as an AC power supply period is applied to a ground (circuit ground) of a circuit board of the touch panel, a potential of the circuit ground fluctuates with respect to an earth potential, thus a variation occurs in a data value of the A/D-converted voltage signal.

Therefore, the control circuit changes the timing for sampling the data until the frequency of the variation in the A/D-converted data is within a range of the allowed value.

Here, the frequency of occurrence of the variation being within the range of the allowed value means that the timing of sampling the A/D converted data is set to match each timing when the fluctuation level becomes substantially constant even if the potential of the circuit ground is fluctuating under the influence of the noise.

Therefore, it becomes possible to eliminate the influence of the noise having periodicity from the A/D-converted data, and A/D-converted values of a period in which the user is performing a touch operation on the touch panel are stabilized.

Thereby, the control circuit will not erroneously determine the presence or absence of a touch operation on the touch panel.

In the touch panel device according to a second aspect, the control circuit sets a sampling period to ½ of a period of the AC power supply, and the timing for sampling the data is changed at less than ½ of the period of the AC power supply.

When the frequency of occurrence of variability is within the range of the allowed value under this condition, the timing at which the control circuit samples the data is in a state in which the noise that varies in the AC power supply period matches with the zero level of the power supply related noise every half cycle.

Therefore, the control circuit can obtain more accurate A/D-converted data, and can perform determination of the presence or absence of the touch operation with high responsiveness.

In the touch panel device according to a third aspect, the control circuit obtains a difference value between currently sampled data and previously sampled data, and monitors the variation according to a presence or absence of the difference value.

That is, if the potential of the circuit ground and the potential of the earth are matched, the value of the continuously obtained A/D-converted data does not change regardless of whether the touch operation has occurred or not, thus the difference in data values between the currently sampled data and previously sampled data does not occur.

On the other hand, if the circuit ground is being influenced by periodic noise, a difference occurs in the data values between the currently sampled data and previously sampled data, thus the variation may be monitored according to the presence or absence of the difference value.

DETAILED DESCRIPTION OF THE PREFERRED EMBODIMENTS

An embodiment will be described below with reference to the drawings.

Figure 9:
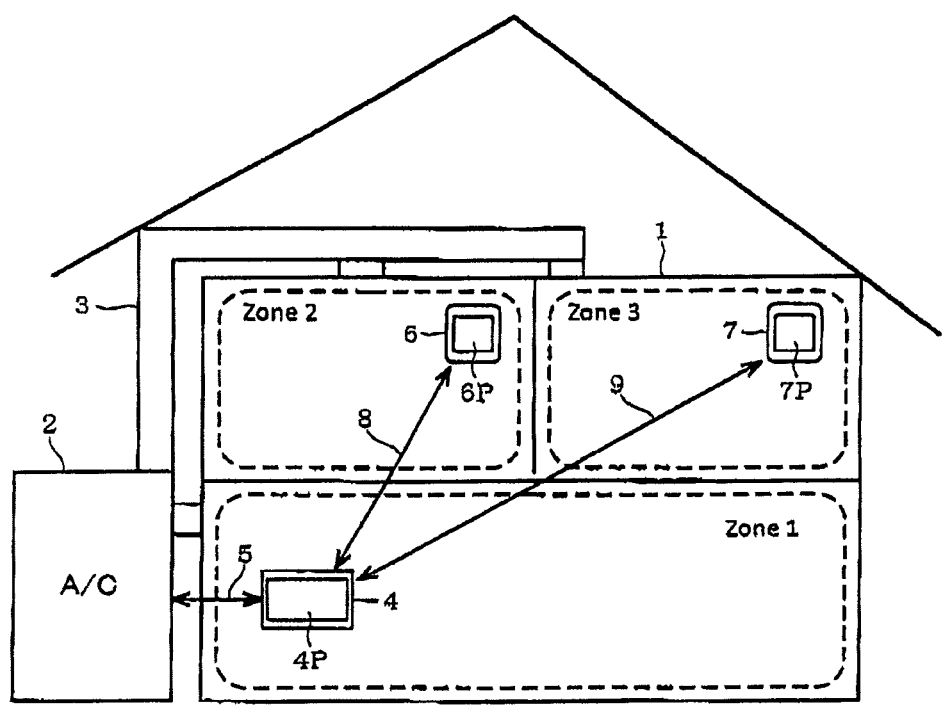
FIG. 9 shows an example of a configuration of a central air conditioning system as a model.

FIG. 9 shows an example of a configuration of a central air conditioning system as a model.

A building 3 has three Zones (rooms) 1-3, and air of which the temperature is controlled by an air conditioner 2 (A/C, an apparatus) is sent to the Zones 1-3 via ducts 3.

A master unit 4 is disposed on a wall of the Zone 1.

The master unit 4 is connected to the air conditioner 2 via a communication line 5, and transmits a control command directly to the air conditioner 2.

In addition, the master unit 4 is capable of receiving control information transmitted from the air conditioner 2.

Further, slave units 6, 7 are disposed on walls of Zone 2 and Zone 3, respectively, and the slave units 6, 7 are connected to the master unit 4 through the communication lines 8, 9, respectively.

The master unit 4 and the slave units 6, 7 are supplied with a commercial AC power source, and are operated by generating an operating DC power supply from the AC power source.

Each of the master unit 4 and the slave units 6, 7, is provided with a touch panel device 4P, 5P, 7P, and an operation instruction of the air conditioner 2 is entered by a user touch-operating the touch panel device 4P, 6P, 7P by a finger.

When the touch panel devices 6P, 7P of the slave units 6, 7 are touch-operated, the operation instructions are sent to the air conditioner 2 via the master unit 4

Figure 8:
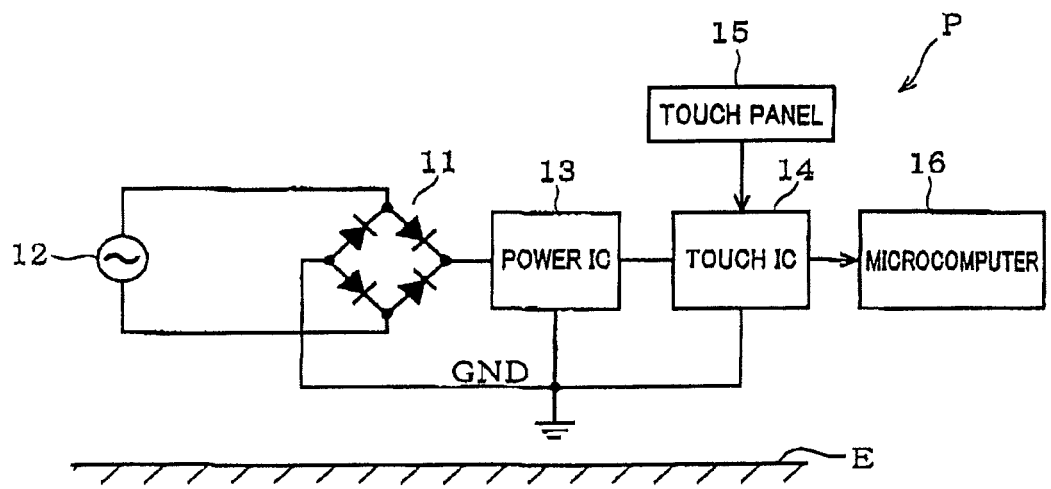
FIG. 8 shows a structure of a touch panel device.

FIG. 8 shows a configuration of the touch panel device P that is common to the master unit 4 and the slave units 6, 7.

AC input terminals or rectifier circuit 11, which is constituted by a diode bridge, are connected to the commercial AC power source 12, and DC output terminals thereof are connected to a power supply IC 13 and a circuit ground GND of the device.

The power IC 13 steps down a voltage rectified by the rectifier circuit 11 after smoothed by capacitors (not shown), and supplies a low voltage of the DC power supply to a touch IC 14 (a signal output unit).

The touch. IC 14 is connected to the touch panel 15, and has a built-in amplifier and an A/D converter (both not shown) or the like.

When the user touch-operates the touch panel 15, a change in capacitance is generated. The touch IC 14 captures the change in capacitance as a change of a voltage signal (C/V conversion). The touch IC 14 A/D-converts the voltage signal at a predetermined period and outputs the converted data to a microcomputer. 16 (a control circuit).

When the microcomputer 16 samples the A/D-converted data that is inputted, the microcomputer 16 determines whether a touch operation of the touch panel by the user has occurred or not based on a change in sampled data values.

Here, the touch IC 14 is asynchronous to the microcomputer 16, and performs A/D conversion at a fixed period, for example, an order of ms or μs. The microcomputer 16 only samples the data that the touch IC 14 sequentially outputs.

As shown in FIG. 8, the circuit ground GND is not connected to the earth E, so that the circuit ground GND is in a state that noise that fluctuates with an AC power source frequency is prone to be mixed in.

Since the A/D converter built into the touch IC 14 also performs A/D conversion using the circuit ground GND as a reference potential, the A/D-converted data that the touch IC 14 outputs to the microcomputer 16 changes when influenced by noise applied to the circuit ground GND.

Therefore, in the present embodiment, when the microcomputer 16 reads the data that the touch IC 14 outputs, timing of the sampling is adjusted so as to eliminate the influence of the noise.

That is, since the noise fluctuates at the AC power source frequency, the influence of noise is eliminated by reading the data at a timing synchronized with the AC power supply voltage so that the noise is always at a constant value.

Next, functions of the present embodiment will be described with reference to FIGS. 1-7.

Figure 1:
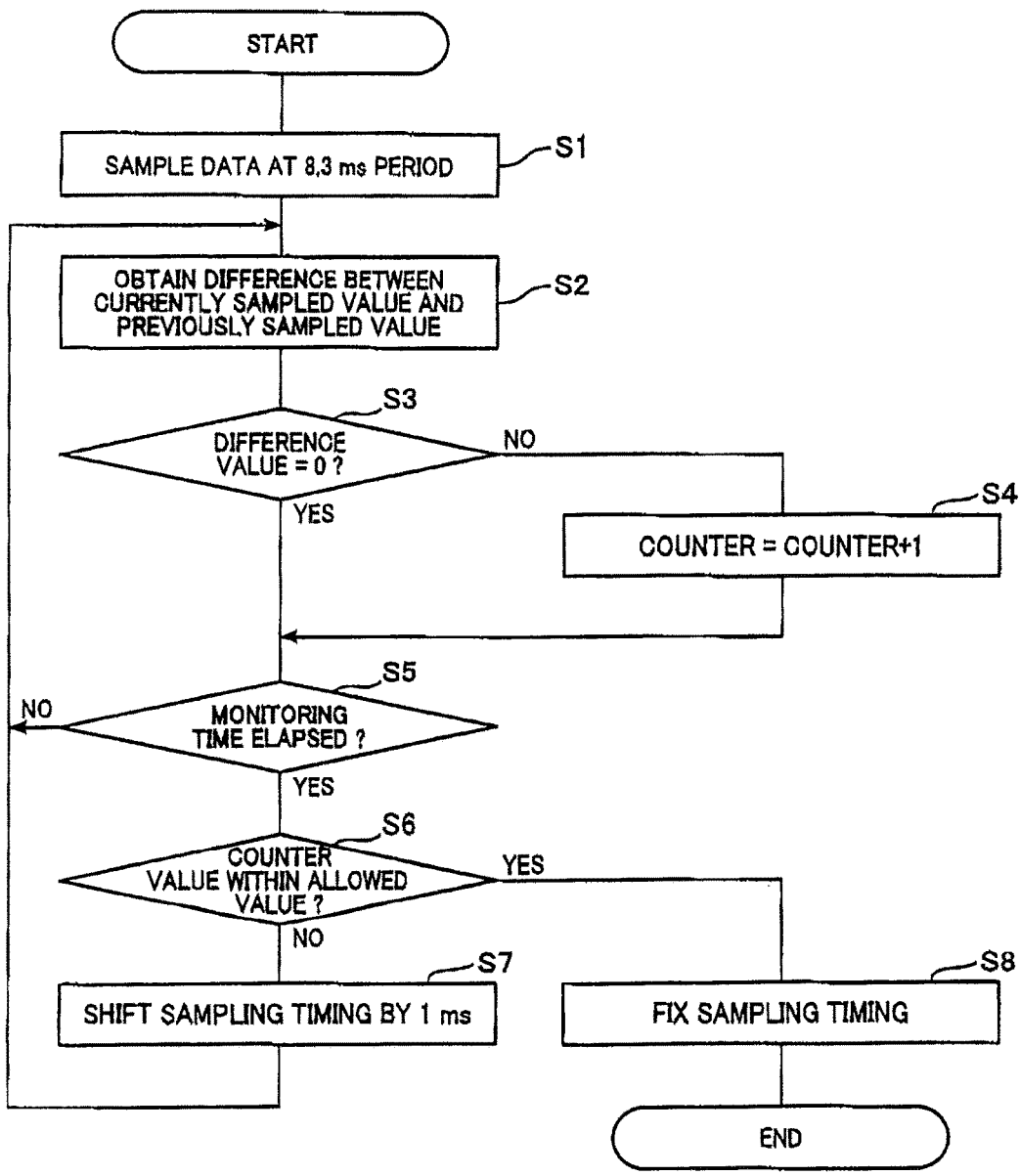
FIG. 1 is an embodiment that shows a flowchart of a process of adjusting sampling timing of an A/D-converted data by a microcomputer.

FIG. 1 is a flowchart showing a process of adjusting the timing that the microcomputer 16 samples the A/D-converted data.

The microcomputer 16 sets a sampling period of the data to 8.3 ms that corresponds to ½ of the commercial AC power supply period (when the frequency is 60 Hz. When the frequency is 50 Hz, the period is set to 10 ms), and starts sampling (step S1).

Here, a reason for setting the sampling period to ½ of the AC power supply period is to perform the sampling at the timing synchronized with a zero point of the level fluctuation due to noise.

In other words, assuming that the voltage fluctuation spans across both positive and negative polarities, the zero point of the change occurs twice, i.e., when the polarity changes from positive to negative and when the polarity so changes from negative to positive within one period.

Therefore, by sampling the data at the timing synchronized with the zero point, it becomes possible for the microcomputer 16 to acquire more stable data values.

After a difference between a currently sampled value and previously sampled value obtained in the subsequent step S2, it is determined whether the value of the difference (difference value) is zero or not (step S3).

If the difference value is zero (YES, i.e., no variation), the process proceeds to step S5, while if the difference value is not zero (NO, i.e., variation present), then a counter is incremented for counting a frequency of occurrence of the variation (S4), and the process proceeds step S5.

In step S5, it is determined whether or not a monitoring time for a timing adjustment (for example, about several seconds, a predetermined period) has elapsed, and if not elapsed (NO), the process returns to step S2.

When the monitoring time has elapsed during repeatedly executing a loop from step S2 to S5 (S5; YES), it is determined whether a value of the counter (counter value) at that time is within the range of the allowed value or not (S6).

If it is not within the range of the allowed value (NO), the timing of sampling the data is shifted, for example, by 1 ms (S7), and the process returns to step S2.

When the counter value becomes within the range of the allowed value (S6: YES) by repeatedly executing the above process, the timing of sampling is fixed at this timing (S8), and an adjusting process is completed.

In a state in which the counter value becomes within the range of the allowed value in step S6 means that the timing of the microcomputer 16 sampling the A/D-converted data matches the timing of a constant fluctuation level that becomes substantially constant every time even if the potential of the circuit ground GND is fluctuated under the influence of noise.

The only timing at which the power supply noise level becomes constant at half cycle intervals is when the fluctuation value becomes zero.

That it, at this time, the influence of the periodic noise on the A/D-converted data is eliminated.

Figure 2:
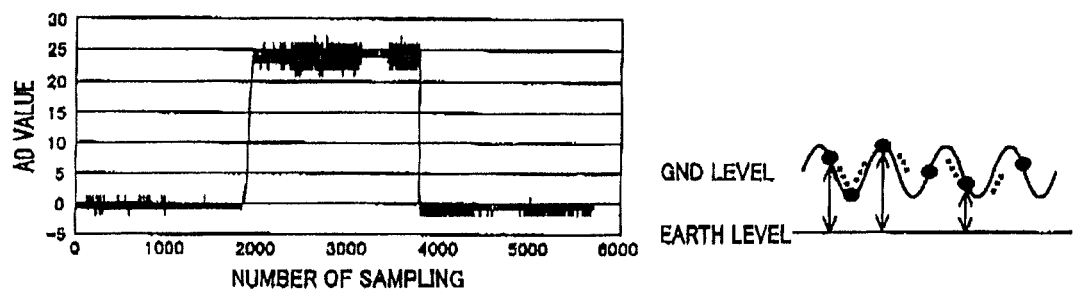
FIG. 2 shows an example of data values obtained when the microcomputer performs a sampling at random timing.

FIG. 2 is an example of data values obtained when the microcomputer 16 performs the sampling at random timing without considering the AC power supply period, and the values during a period in which the user performs a touch operation generally change in a range of about 21 to 27.

Figure 3:
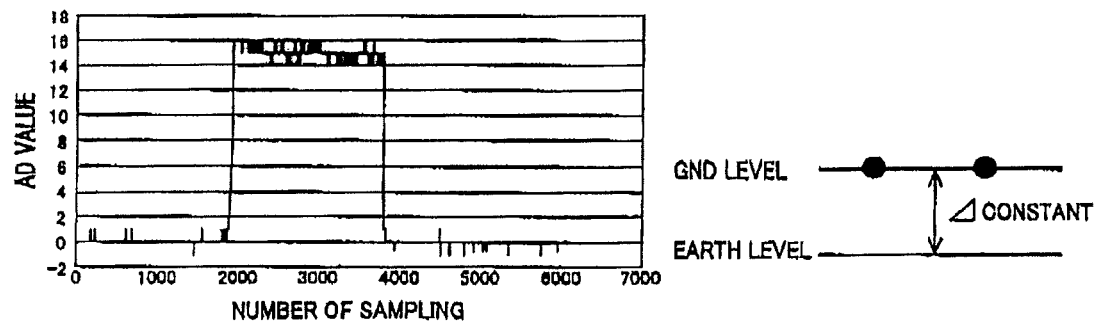
FIG. 3 shows a diagram equivalent to FIG. 2 in a case of connecting a circuit ground GND to the earth E.

FIG. 3 shows a case of performing the sampling at a random timing similarly to FIG. 2 when the circuit ground GND is connected to the earth E.

Data values during the period of performing the touch operation are stable in a range of 15±1.

Figure 4:
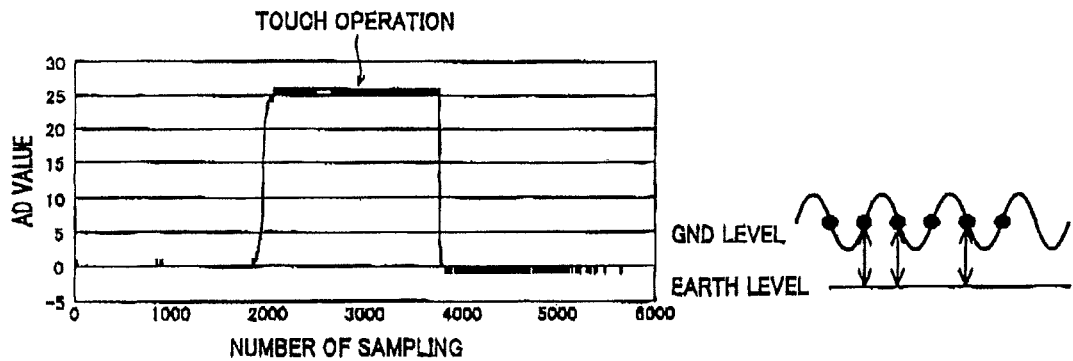
FIG. 4 shows an example of data values obtained when timing has been adjusted in the present embodiment.

FIG. 4 shows a case of performing the timing adjustment of the present embodiment, where data values during the period of performing the touch operation are also stable in a range of 25+1.

Figure 5:
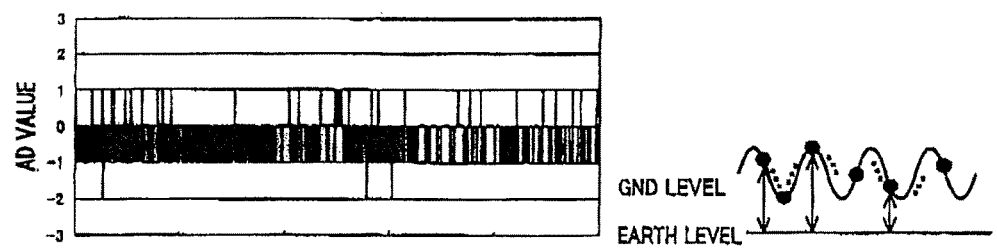
FIG. 5 shows a variation of the data corresponding to FIG. 2.
Figure 6:
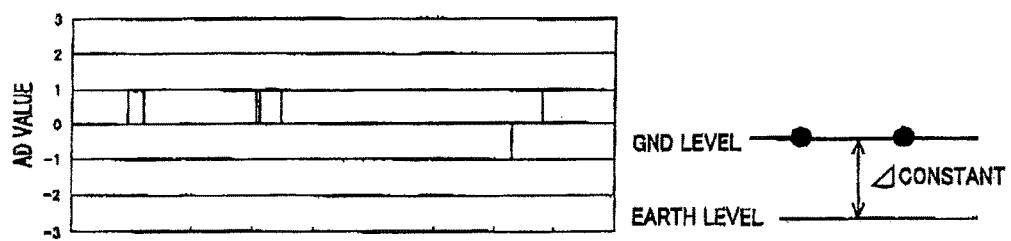
FIG. 6 shows a variation of the data corresponding to FIG. 3.
Figure 7:
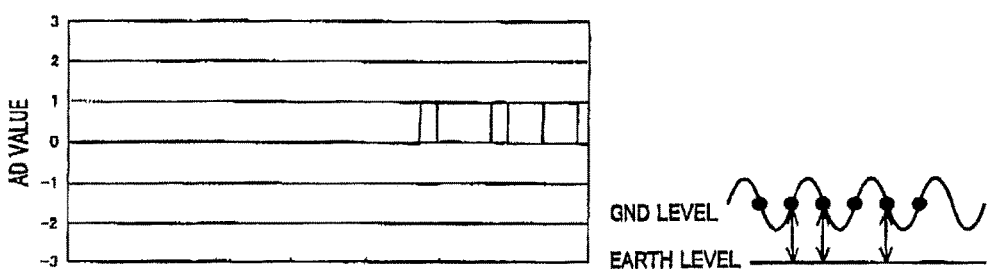
FIG. 7 shows a variation of the data corresponding to FIG. 4.

Further, FIGS. 5 to 7 are results of obtaining difference values between data samples in correspondence with FIGS. 2 to 4, respectively.

The data values in FIG. 5 fluctuate almost continuously, while there is almost no fluctuation in FIG. 6.

Then, in FIG. 7 that corresponds to the present embodiment, the data values do not fluctuate, substantially the same as that of FIG. 6, thus it can be realized that it is possible to obtain the data value in a stable state.

According to the present embodiment as described above, the microcomputer 16 of the touch panel device P monitors differences between data values when sampling the A/D-converted data of the voltage signal that the touch IC 14 outputs at a fixed period, and changes the timing for sampling the data when the frequency of the variation exceeds the allowed value.

Then, when the frequency of the variation is within the range of the allowed value, the timing is kept constant and the data are sampled.

This can eliminate the influence of the noise having periodicity to the A/D-converted data, and A/D-converted values of a period in which the user is performing the touch operation on the touch panel 15 are stabilized.

Therefore, the microcomputer 16 will not erroneously determine the presence or absence of the touch operation on the touch panel 15.

Further, the microcomputer 16 sets the sampling period to be ½ of the AC power supply period, and changes the timings for sampling the data at less than ½ of the sampling period.

When the frequency of occurrence of variability is within the range of the allowed value under this condition, the timing that the microcomputer 16 samples the data is in a state in which the noise that varies in the AC power supply period matches with the zero level that reach every half cycle.

Therefore, the microcomputer 16 will be able to get more accurate A/D-converted data, and can perform determination of the presence or absence of the touch operation with high response.

In addition, the microcomputer 16 obtains a difference value between the currently sampled data and the previously sampled data, and monitors the variation according to the presence or absence of the difference value.

That is, if the potential of the circuit ground GND and the potential of the earth E are matched, the value of the A/D-converted data obtained continuously does not change in each state that the touch operation has occurred or not, thus the difference in data values between the currently sampled data and previously sampled data does not occur.

On the other hand, if the circuit ground GND is under the influence of the periodic noise, the difference occurs in the data values between the currently sampled data and previously sampled data, thus the variation may be monitored according to the presence or absence of the difference value.

The present disclosure is not limited only to the embodiments described above or the embodiments described in the drawings, but the following variations or extensions may be possible.

The time to adjust the sampling timing is not limited to 1 ms, but it may be set according to individual design in a range of less than ½ of the AC power supply period.

Further, the sampling may be performed in one period of the commercial AC power supply period, and in this case, the time to adjust the sampling timing may be set in a range of less than the AC power supply period.

If it is necessary to eliminate the influence of noise with a known periodicity other than the noise derived from the AC power source, the sampling period may be set based on the period, and the sampling timing may be adjusted in a range of less than the sampling period.

The microcomputer having a function of the control circuit may be integrally provided with a touch IC as a signal output unit.

In other words, a voltage signal may be A/D-converted by an A/D converter that the microcomputer has.

Devices for performing an input operation are not necessarily separated into a master unit and a slave unit.

Further, the touch panel device P may be attached to a main body of the air conditioner 2.

What is claimed is:

1. A touch panel device comprising:
   a touch panel operated by AC power supply, the touch panel being configured to receive an input of an operation instruction, from a user, controlling an apparatus;
   a signal output unit in communication with the touch panel, the signal output unit A/D converting a voltage signal corresponding to a change of capacitance in the touch panel and outputting converted data based on the converted voltage signal; and
   a control circuit in communication with the signal output unit, the control circuit being configured to:
      sample the converted data from the signal output unit at a predetermined period of time;
      determine whether a touch operation received by the touch panel has occurred or not based on the converted data acquired by sampling;
      output a determination result to the signal output unit;
      monitor and detect a variation of values of the converted data for the predetermined period of time;

upon detecting that a frequency of the variation of the values exceeds an allowed value, change a timing of sampling the data to determine whether the touch operation of the touch panel occurred within the predetermined period of time; and upon detecting that the frequency of the variation of the values does not exceed the allowed value, maintain the timing and continue to sample the data.

2. The touch panel device according to claim 1, wherein, the control circuit sets a sampling period to ½ of a period of the AC power supply; and the timing for sampling the data is changed at less than ½ of the period of the AC power supply.

3. The touch panel device according to claim 2, wherein, the control circuit obtains a difference value between currently sampled data and previously sampled data, and monitors the variation according to a presence or absence of the difference value.

4. The touch panel device according to claim 3, wherein, the apparatus is an air conditioner.

5. The touch panel device according to claim 2, wherein, the apparatus is an air conditioner.

6. The touch panel device according to claim 1, wherein, the control circuit obtains a difference value between currently sampled data and previously sampled data, and monitors the variation according to a presence or absence of the difference value.

7. The touch panel device according to claim 6, wherein, the apparatus is an air conditioner.

8. The touch panel device according to claim 1, wherein, the apparatus is an air conditioner.

* * * * *